United States Patent

Dötsch et al.

[11] B 3,986,181

[45] Oct. 12, 1976

[54] METHOD OF AND DEVICE FOR DETECTING CYLINDRICAL MAGNETIC DOMAINS BY MEANS OF FERRIMAGNETIC RESONANCE

[75] Inventors: Horst Dötsch, Pinneberg; Jürgen Müller, Hamburg; Hans-Jürgen Schmitt, Pinneberg, all of Germany

[73] Assignee: U.S. Philips Corporation, New York, N.Y.

[22] Filed: June 5, 1974

[21] Appl. No.: 476,681

[44] Published under the second Trial Voluntary Protest Program on January 13, 1976 as document No. B 476,681.

[30] Foreign Application Priority Data

June 18, 1973  Germany............................ 2330963

[52] U.S. Cl...................... 340/174 TF; 340/174 GB
[51] Int. Cl.²......................................... G11C 11/14
[58] Field of Search................. 340/174 GB, 174 TF

[56] References Cited
UNITED STATES PATENTS

| 3,824,573 | 7/1974 | Scarzello | 340/174 TF |
| 3,836,897 | 9/1974 | Marsh | 340/174 TF |

*Primary Examiner*—James W. Moffitt
*Attorney, Agent, or Firm*—Frank R. Trifari; George B. Berka

[57] ABSTRACT

A method of detecting movable cylindrical magnetic domains produced in a magnetic crystal film supported on a substrate in which a microwave signal is transmitted into a restricted region between two planar conductors by means of a ferrimagnetic resonance mode, and the presence of a domain is detected from the measuring signal variation when the echoes of elastic waves in the film vary.

6 Claims, 4 Drawing Figures

METHOD OF AND DEVICE FOR DETECTING CYLINDRICAL MAGNETIC DOMAINS BY MEANS OF FERRIMAGNETIC RESONANCE

The invention relates to a method of and a device for detecting movable cylindrical magnetic domains.

When magnetic crystal films whose axis of magnetization is perpendicular to the plane of the film are magnetised in said direction by an external magnetic field $H_o$, cylindrical domains occur in a given field range (cp. A. H. Bobeck et al.; Application of Orthoferrites to Domain-Wall Devices, I.E.E.E. Trans.Mag. 5, 544 (1969); R. D. Lock et al.; Magnetic bubbles and their Applications, Radio and Electr. Eng. 42, 435 (1972); A. H. Bobeck et al.; Magnetic Bubbles, Scient. Amer. 224, 78 (1971)). In these cylindrical domains, sometimes termed "bubbles", the magnetisation is oriented oppositely to the magnetisation of the surroundings directed parallel to the external field $H_o$. The cylindrical domains are energetically stable and can be moved at a high rate by providing field gradients in the plane of the film; rates up to $10^5$ cm/sec were achieved.

The two states "magnetisation antiparallel" and "magnetisation parallel" and "bubble" and "no bubble", respectively, may be used for the binary processing and storage of information. Due to the small diameter of the cylindrical domains (between 1 and 100 $\mu$m) very large storage densities can be obtained.

Nowadays, structures of permalloy are commonly used for a directed guiding of the cylindrical domains, which structures are provided on the crystal. Said structures are polarised by an in plane magnetic field $H_r$. The cylindrical domains are then attracted by the corresponding poles and are thus restricted to the guiding structure. By rotating the field $H_r$ in the plane of the film, the polarity of the structure is inversed and the cylindrical domains are moved to new equilibrium states. The direction of the movement is determined by the shape of the guiding structure and the direction of rotation of $H_r$. By suitable measures, new cylindrical domains can be generated at the beginning of the structure and domains present at the end of the structure can be erased. In order to further process the information recorded in the crystal film it is necessary to detect the cylindrical domains, that is to say to convert their presence or absence in a place in the crystal into a suitable signal (for example, an electric or optical signal). For that purpose essentially three methods are known (cp. W. Strauss; Detection of Cylindrical Magnetic Domains, J.Appl. Phys. 42, 1251 (1971); G. S. Almasi, Bubble Domain Propagation and Sensing, Proc. I.E.E.E., 61, 438 (1973)):

1. When linearly polarised light is passed through the crystal film, the direction of polarisation is rotated, the direction of rotation depending upon the direction of magnetisation. It may then be established by means of an analyser whether the light has or has not passed a domain.

2. A Hall probe is provided on the crystal film and the variation of the Hall voltage caused by the magnetic stray field of a cylindrical domain is measured.

3. A probe whose resistance is dependent on the magnetic field is provided on the crystal film. The resistance variation caused by the magnetic stray field of a cylindrical domain is then determined. In contrast with the second method, only two current supplies to the probe are necessary in this case.

Although the first method provides a better signal-to-noise ratio than the two other methods, the carrying-out is much more complicated and large packing densities cannot be obtained. The carrying-out of the third method is easier than that of the second and since they both supply approximately equally large signals, the third method is nearly exclusively used nowadays. The difficulties occurring consist mainly in that the complicated technological methods which have to be used for providing the resistance probe on the crystal film have an interfering influence on each other. With this method a signal-to-noise ratio of 4 : 1 was achieved for cylindrical domains having a diameter of 4 $\mu$m which, however, were expanded for detection to form 12 $\mu$m long strip domains.

The present invention on the contrary provides a method of which the technical construction is simpler and which provides a better signal-to-noise ratio.

The invention is characterized in that in a restricted region of the magnetic crystal film in which the cylindrical domains are to be detected, a microwave signal is transmitted between two planar conductors by means of a ferrimagnetic resonance mode, and the presence of a cylindrical domain is established from the measurable signal variation when the local magnetisation condition varies.

The technological processes for manufacturing the inventive detection structure do not influence each other any longer and the detection structure need not be provided directly on the crystal film but may have the form of a covering structure. For cylindrical domains having a diameter of 5 $\mu$m, a signal-to-noise ratio was already achieved which is 50% larger than the above-mentioned ratio obtained with the resistance probe; moreover, the cylindrical domain need not be expanded to form a strip domain.

The invention will be described in greater detail with reference to the accompanying drawing in which FIG. 1 is a diagrammatic plan view of a device according to the invention;

When a high frequency alternating magnetic field is applied perpendicularly to the direction of magnetisation of the crystal film, that is to say in the plane of the film, the "spins" are energized to precession movements. Resonance occurs when the frequency of the high frequency field corresponds to the natural frequency of the "spin" system which in the case of magnetic saturation is given to an approximation by:

$$\omega = \gamma (H_i + H_a),$$

wherein $\gamma = 2.8$ MHz/Oe, $H_i$ is the internal field and $H_a$ is the anisotropy field. At lower frequencies further resonances occur at which the high frequency magnetisation is no longer spatially homogeneous.

Said resonances are used for detecting the cylindrical domains. In a region of the crystal film of which the expansion is comparable to the size of a cylindrical domain, the ferrimagnetic resonance produced by microwaves is used for the signal transmission between two high frequency lines. When a cylindrical domain is transferred to said region, it varies here the internal field and thus has a disturbing influence on the resonance. Said disturbance is then measured as a variation of the transmitted signal.

Since the microwaves can be adapted very poorly to the "spin" system, only a small part of the microwave energy penetrates into the crystal film (approximately −20 dBm); the remainder is reflected. So only a small signal can be transferred by the resonance. Therefore a circuit arrangement has to be provided in which the electromagnetic cross-talk occurring already without resonance is suppressed sufficiently strongly.

Figure 1:
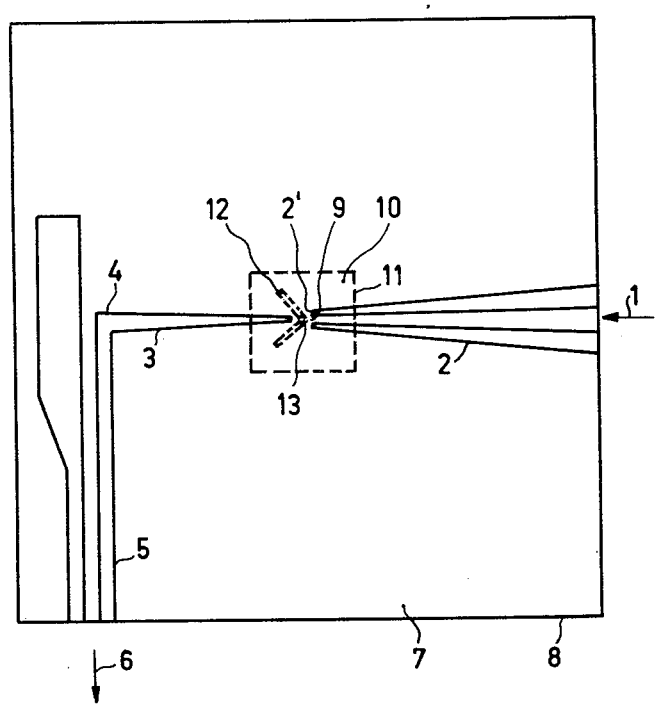

As shown in FIG. 1, the microwaves are supplied to the high frequency input 1 via a coplanar line 2 which is shortcircuited at the point 2'. A slot conductor 3 which is also shortcircuited begins opposite to said shortcircuit. In Point 4 same is transformed in a wide band manner to form a coplanar conductor 5 which leads to the high frequency output 6. The region between the two shortcircuits is the coupling or transfer region 9. Outside the resonance, a decoupling of 70–75 dB is measured between the input and output. The conductor structures are etched in a 0.3 μm thick gold layer 7 which is vapour-deposited on a glass substrate 8.

Figure 2:
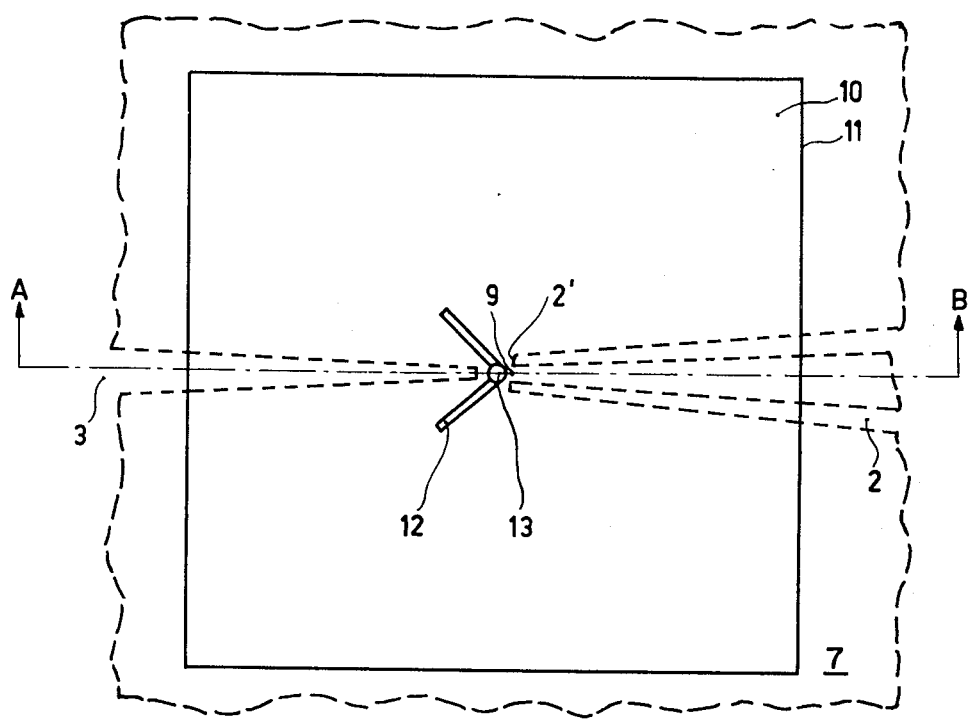
FIG. 2 shows a bottom view of a detail of FIG. 1 on an enlarged scale.
Figure 3:
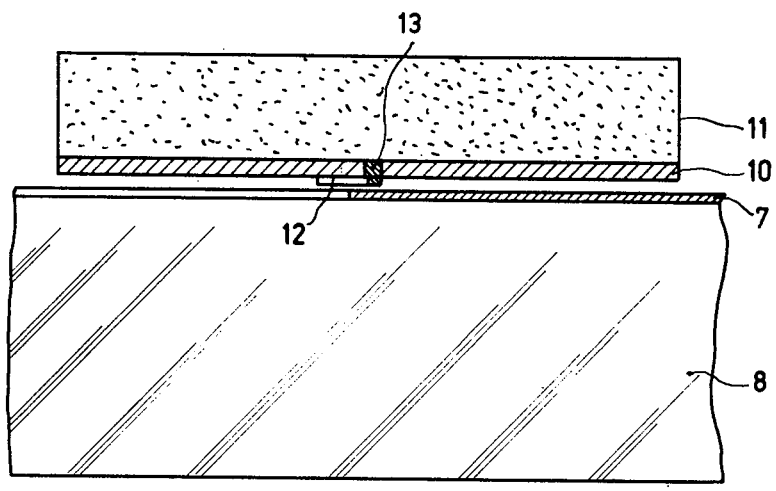

FIGS. 2 and 3 are a diagrammatic bottom view and a diagrammatic cross-sectional elevation view, respectively, on an enlarged scale of the transfer or coupling region 9 and the surroundings thereof. Above the coupling region there is the magnetic crystal film 10 which is provided with grown on the substrate 11. The film is a simplified conductor structure 12 of permalloy. When a cylindrical domain 13 lands in the coupling region 9 a variation of the transferred signal is found in the case of resonance. The sign and value of said variation depend upon the relative orientation of the magnetic crystal film relative to the microwave structure.

"Bubble" materials are often used whose width of the magnetic resonance lines is too large for said measurements. In this case the method of detection may be varied so that the conductor structure in the coupling region extends on a magnetic crystal film having a small line width. The signal transferred in said crystal film by the resonance is then varied in a measurable manner by the magnetic stray field of a cylindrical domain which is present in a crystal film which is present above it and has a large line width. In this method it is advantageous to use a higher order resonance mode instead of the uniform precession.

Figure 4:
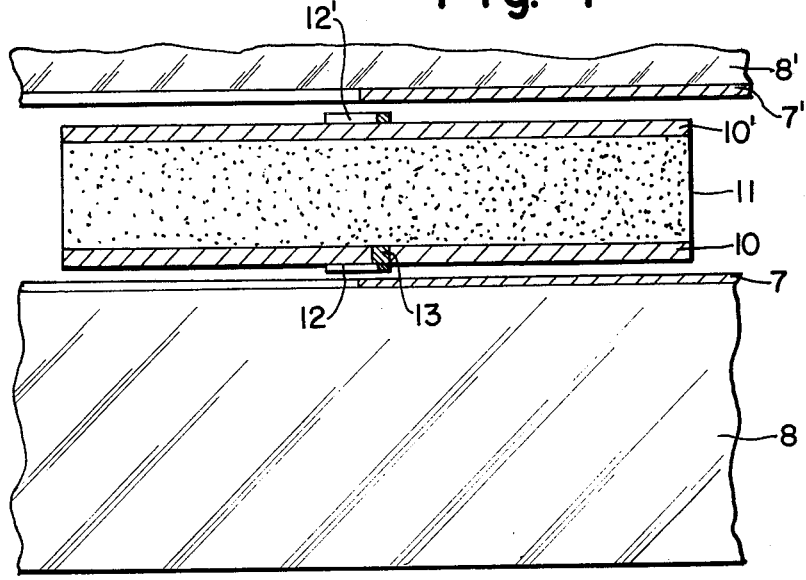
FIG. 3 is a diagrammatic cross-sectional elevation view of the device according to this invention and FIG. 4 is a cross-sectional view of another embodiment of the device according to this invention.

A further variation of the detection method profits by the interaction between the "spin" system and the elastic waves in the crystal. Elastic waves are produced in the magnetic film 10 by said magneto-elastic coupling; said waves are reflected against the polished rear side of the substrate 11 and provide an echo after a corresponding delay time. The amplitude of the echoes then again depends upon whether in the coupling region a cylindrical domain is present or is not present. The advantage of this method is that at the instant of detection, that is to say at the instant at which the echo arrives, a possibly still interfering cross-talk signal can be switched off (pulse operation). Moreover, in the device for performing this method one or both conductors 2, 3 of the microwave conductor structure 7', as shown in FIG. 4, might be provided on the rear side of the substrate 11 for the case in which a magnetic film 10' having the same properties as the film on the front side has also been grown on said side.

What is claimed is:

1. A device for detecting movable cylindrical magnetic domains produced in a magnetic crystal film supported on one side of a substrate, comprising a coplanar conductor disposed on and shortcircuited in a restricted transfer region of the film to feed-in a microwave signal, and a slot conductor shortcircuited in the transfer region and transformed into a wide band coplanar conductor to feed out signal variation in the region.

2. A method of detecting movable cylindrical magnetic domains produced in a magnetic crystal film supported on a substrate, comprising the steps of transmitting a microwave signal to a restricted region on the film via a coplanar line shortcircuited at the region to produce a ferrimagnetic resonance therein, and measuring signal variations induced in a slot conductor shortcircuited in the region and transformed into a wide band coplanar conductor.

3. A method as claimed in claim 2 wherein the signal variations are induced by echoes of elastic waves resulting in the film due to the magneto-electric interaction in said region.

4. A method as claimed in claim 3 wherein at the instant of the detection of the echoes the energizing microwaves are switched off.

5. A device for detecting movable cylindrical magnetic domains produced in a magnetic crystal film supported on one side of a substrate, comprising an additional magnetic crystal film supported on the opposite side of the substrate, two microwave lines provided on each film and shortcircuited opposite each other in a restricted transfer region to feed in and out a microwave signal, whereby signal variations corresponding to variations in local magnetization of a film region underlying said transfer region, are detectable in one of the feed-out lines.

6. A device as claimed in claim 5 wherein one line is a coplanar conductor shortcircuited in a restricted region and the other line is a slot conductor shortcircuited in the region and transformed into a wide band coplanar conductor.

* * * * *